United States Patent
Lu et al.

(10) Patent No.: US 9,275,186 B2
(45) Date of Patent: *Mar. 1, 2016

(54) OPTIMIZATION FOR CIRCUIT MIGRATION

(71) Applicant: Taiwan Semiconductor Manufacturing Company, Ltd., Hsin-Chu (TW)

(72) Inventors: Lee-Chung Lu, Taipei (TW); Yi-Kan Cheng, Taipei (TW); Chung-Hsing Wang, Baoshan Township (TW); Chen-Fu Huang, Kaohsiung (TW); Hsiao-Shu Chao, Baoshan Township (TW); Chin-Yu Chiang, New Taipei (TW); Ho Che Yu, Zhubei (TW); Chih Sheng Tsai, Taichung County (TW); Shu Yi Ying, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,845

(22) Filed: May 2, 2014

(65) Prior Publication Data

US 2014/0245251 A1    Aug. 28, 2014

Related U.S. Application Data

(63) Continuation of application No. 12/846,594, filed on Jul. 29, 2010.

(60) Provisional application No. 61/231,520, filed on Aug. 5, 2009.

(51) Int. Cl.
  *G06F 17/50* (2006.01)

(52) U.S. Cl.
  CPC .......... *G06F 17/5081* (2013.01); *G06F 17/505* (2013.01); *G06F 17/5068* (2013.01)

(58) Field of Classification Search
  CPC  G06F 17/5081; G06F 17/5072; G06F 17/503
  USPC ................ 716/113, 108, 134, 103, 122, 123; 703/16
  See application file for complete search history.

(56) References Cited

U.S. PATENT DOCUMENTS

| | | |
|---|---|---|
| 5,648,911 A | 7/1997 | Grodstein et al. |
| 6,324,671 B1 | 11/2001 | Ratzel et al. |
| 6,845,494 B2 | 1/2005 | Burks et al. |
| 7,340,712 B2 | 3/2008 | Correale, Jr. |
| 7,684,969 B2 | 3/2010 | Habitz et al. |

(Continued)

*Primary Examiner* — Phallaka Kik
(74) *Attorney, Agent, or Firm* — Slater & Matsil, L.L.P.

(57) ABSTRACT

An embodiment is a method for providing an adjusted electronic representation of an integrated circuit layout, the method including using one or more processor, generating a timing performance of a path in a first netlist, identifying a first cell in the path that violates a timing performance parameter, and generating a plurality of derivative cells from a subsequent cell that is in the path after the first cell, where each derivative cell includes a variation of the subsequent cell. The method further includes in response to the identifying the first cell, replacing the subsequent cell with at least one of the plurality of derivative cells to generate a first modified netlist, where the variation of the at least one of the plurality of derivative cells reduces the violation of the timing performance parameter, and generating a final netlist based on the first modified netlist.

17 Claims, 6 Drawing Sheets

(56) References Cited

U.S. PATENT DOCUMENTS

| | | |
|---|---|---|
| 7,784,012 B2 | 8/2010 | Correale, Jr. |
| 8,151,235 B2 * | 4/2012 | Chow et al. ............ 716/121 |
| 8,510,700 B2 | 8/2013 | Cocchi et al. |
| 2003/0009734 A1 | 1/2003 | Burks et al. |
| 2003/0084418 A1 | 5/2003 | Regan |
| 2003/0088842 A1 | 5/2003 | Cirit |
| 2004/0243964 A1 | 12/2004 | McElvain et al. |
| 2005/0022141 A1 | 1/2005 | Walker et al. |
| 2005/0165855 A1 | 7/2005 | Marshall et al. |
| 2005/0218871 A1 | 10/2005 | Kang et al. |
| 2006/0010409 A1 * | 1/2006 | Tamaki et al. ............ 716/6 |
| 2006/0064659 A1 | 3/2006 | Ushiyama et al. |
| 2006/0248486 A1 | 11/2006 | Barnes |
| 2007/0067748 A1 | 3/2007 | Amit et al. |
| 2007/0099314 A1 | 5/2007 | Chen et al. |
| 2009/0306953 A1 * | 12/2009 | Liu et al. ............ 703/14 |
| 2010/0050139 A1 | 2/2010 | Abadir et al. |
| 2010/0318951 A1 | 12/2010 | Foreman et al. |
| 2011/0035717 A1 | 2/2011 | Lu et al. |
| 2012/0139582 A1 * | 6/2012 | Cocchi et al. ............ 326/41 |
| 2013/0191803 A1 | 7/2013 | Chow et al. |

* cited by examiner

OPTIMIZATION FOR CIRCUIT MIGRATION

PRIORITY CLAIM

This application is a continuation of, and claims the benefit of, U.S. patent application Ser. No. 12/846,594, filed on Jul. 29, 2010, titled "Design Optimization for Circuit Migration," which application is hereby incorporated by reference, and which further claims the benefit of U.S. Provisional Application No. 61/231,520, filed on Aug. 5, 2009, titled "Optimization for Circuit Migration," which application is hereby incorporated by reference.

TECHNICAL FIELD

The present invention relates generally to a method and computer program product for semiconductor device design, and more particularly to a method and computer program product for the design of a semiconductor device migrating to a smaller technology node.

BACKGROUND

Generally in integrated circuit design, integrated circuit chip layouts are commonly shrunk, or scaled, to smaller technology nodes to reduce product costs and extend the product's life cycle. Processes that realized this shrinking or scaling are generally known as shrink technology. However, these processes are not without their drawbacks.

Known processes typically require a designer to scale down by a fixed factor a taped-out chip layout from one technology node to a smaller technology node. Scaling down a layout in this manner usually results in process variations between the technology nodes and in performance variation. Some process variations that may arise are problems in gate processing, such as forming gate spacers, gate oxide thickness, metal thickness, etching bias, mask making, optical proximity correction (OPC). Performance variations could be changes in timing of the circuit caused from changed capacitances and resistances of the scaled down devices and metal layers, traces, and the like.

Any problems in the scaled down layout generally would be corrected manually through an engineering change order (ECO). The problems typically would be discovered during implementation, such as by using electronic design automation (EDA) software. Then once the problem was discovered, an ECO would generally require a designer to manually fine tune the layout. Then, the layout would be implemented again, such as by using an EDA, to determine if the problem remains. This would continue until the problem was solved. These processes thus generally use many man-hours to bring the scaled down layout to tape-out. Accordingly, there is a need in the art to optimize the migration of integrated circuit chip layouts to smaller technology nodes without requiring the inefficient use of many man-hours.

SUMMARY OF THE INVENTION

These and other problems are generally solved or circumvented, and technical advantages are generally achieved, by embodiments of the present invention which minimize the man hours and effort expended on the design of the shrink node technology while maintaining comparable design quality.

An embodiment of the present invention is a computer program product for providing an adjusted electronic representation of an integrated circuit layout. The computer program product has a medium with a computer program embodied thereon. Further, the computer program comprises computer program code for providing full node cells from a full node netlist, computer program code for scaling the full node cells to provide shrink node cells, computer program code for providing a timing performance of the full node cells and the shrink node cells, computer program code for comparing the timing performance of the full node cells to the timing performance of the shrink node cells, and computer program code for providing a first netlist.

A second embodiment of the present invention is a computer program product for providing an adjusted electronic representation of an integrated circuit layout. The computer program product has a medium with a computer program embodied thereon. Further, the computer program comprises computer program code for providing a timing performance of a path in a first netlist, computer program code for identifying a first cell in the path that violates a timing performance parameter, computer program code for providing a first modified netlist comprising a variation of the first netlist to compensate for the first cell in the path that violates the timing performance parameter, and computer program code for providing a final netlist.

In accordance with another embodiment of the present invention, a method for providing an adjusted electronic representation of an integrated circuit layout comprises generating full node cells from a full node netlist, scaling the full node cells to provide shrink node cells, providing a timing performance of the full node cells and the shrink node cells, comparing the timing performance of the full node cells to the timing performance of the shrink node cells, generating derivative cells of at least one shrink node cell, providing a timing performance of the derivative cells, comparing the timing performance of the derivative cells to the timing performance of the full node cells, and providing a first netlist comprising at least one derivative cell that minimizes a difference between the timing performance of the at least one shrink node cell and a corresponding full node cell. Each derivative cell comprises a variation of the at least one shrink node cell.

In accordance with a further embodiment of the present invention, a method for providing an adjusted electronic representation of an integrated circuit layout comprises providing a timing performance of a path in a first netlist, identifying a first cell in the path that violates a timing performance parameter, providing a first modified netlist comprising a variation of the first netlist to compensate for the first cell in the path that violates the timing performance parameter, and providing a final netlist. The variation includes a first derivative cell of the first cell or a subsequent derivative cell of a subsequent cell that is in the path after the first cell such that the violation of the timing performance parameter is minimized.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely the migration of an integrated circuit chip layout to a smaller technology node, such as in shrink technology. The invention may also be applied, however, to the migration of an integrated circuit chip layout to a larger technology node.

Figure 1:
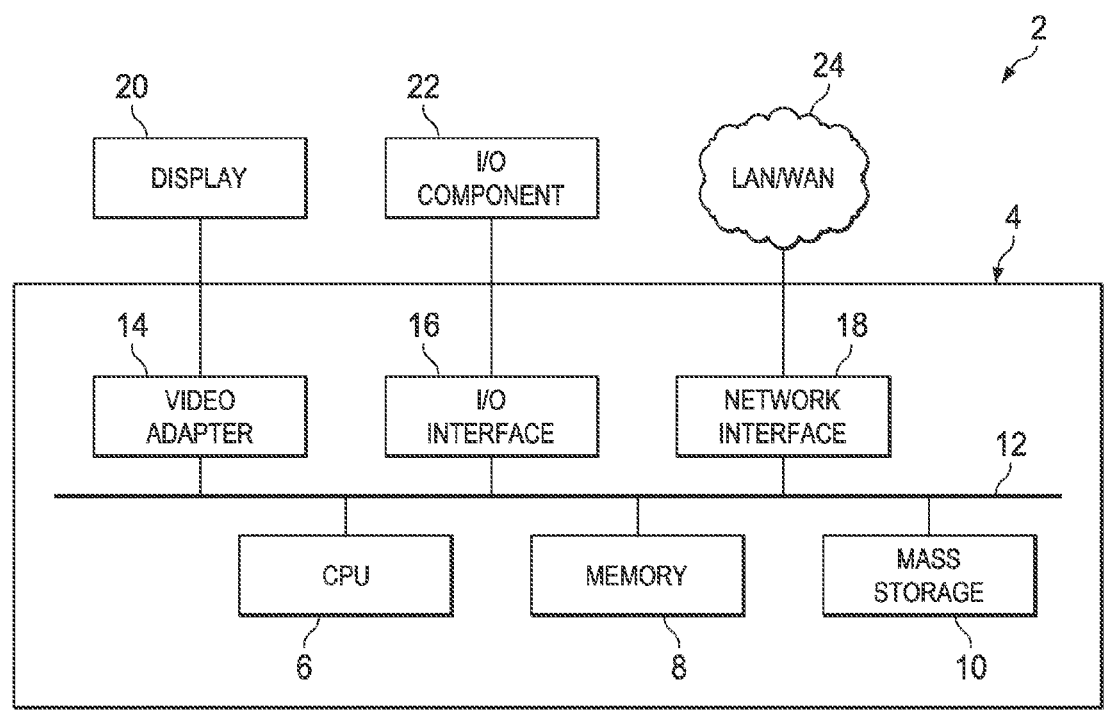
FIG. 1 is a block diagram of a processing system in accordance with an embodiment of the present invention.

Referring now to FIG. 1, a block diagram of a processing system 2 is provided in accordance with an embodiment of the present invention. The processing system 2 is a general purpose computer platform and may be used to implement any or all of the processes discussed herein. The processing system 2 may comprise a processing unit 4, such as a desktop computer, a workstation, a laptop computer, or a dedicated unit customized for a particular application. The processing system 2 may be equipped with a display 20 and one or more input/output devices 22, such as a mouse, a keyboard, or printer. The processing unit 4 may include a central processing unit (CPU) 6, memory 8, a mass storage device 10, a video adapter 14, and an I/O interface 16 connected to a bus 12.

The bus 12 may be one or more of any type of several bus architectures including a memory bus or memory controller, a peripheral bus, or video bus. The CPU 6 may comprise any type of electronic data processor, and the memory 8 may comprise any type of system memory, such as static random access memory (SRAM), dynamic random access memory (DRAM), or read-only memory (ROM).

The mass storage device 10 may comprise any type of storage device configured to store data, programs, and other information and to make the data, programs, and other information accessible via the bus 12. The mass storage device 10 may comprise, for example, one or more of a hard disk drive, a magnetic disk drive, or an optical disk drive.

The video adapter 14 and the I/O interface 16 provide interfaces to couple external input and output devices to the processing unit 4. As illustrated in FIG. 1, examples of input and output devices include the display 20 coupled to the video adapter 14 and the I/O device 22, such as a mouse, keyboard, printer, and the like, coupled to the I/O interface 16. Other devices may be coupled to the processing unit 4, and additional or fewer interface cards may be utilized. For example, a serial interface card (not shown) may be used to provide a serial interface for a printer. The processing unit 4 also may include a network interface 18 that may be a wired link to a local area network (LAN) or a wide area network (WAN) 24 and/or a wireless link.

It should be noted that the processing system 2 may include other components. For example, the processing system 2 may include power supplies, cables, a motherboard, removable storage media, cases, and the like. These other components, although not shown, are considered part of the processing system 2.

Embodiments of the present invention are implemented on the processing system 2, such as by program code executed by the CPU 6, for example an electronic design automation (EDA) program. The following description will describe how embodiments are implemented on the processing system 2, yet such descriptions do not limit the scope of embodiments of the present invention but are intended only to be exemplary.

Embodiments may use one or two phases to realize an integrated circuit layout for a scaled down technology node. Generally, a first phase may include scaling down the original layout from the original technology node by a fixed factor to a smaller technology node. Then, derivative libraries may be used to generate a layout that minimizes the performance difference of the smaller technology node from the original technology node. A second phase may include altering the layout to maximize performance of the layout if performance parameters to which the layout is desired to meet are known. More details are discussed herein.

Figure 2:
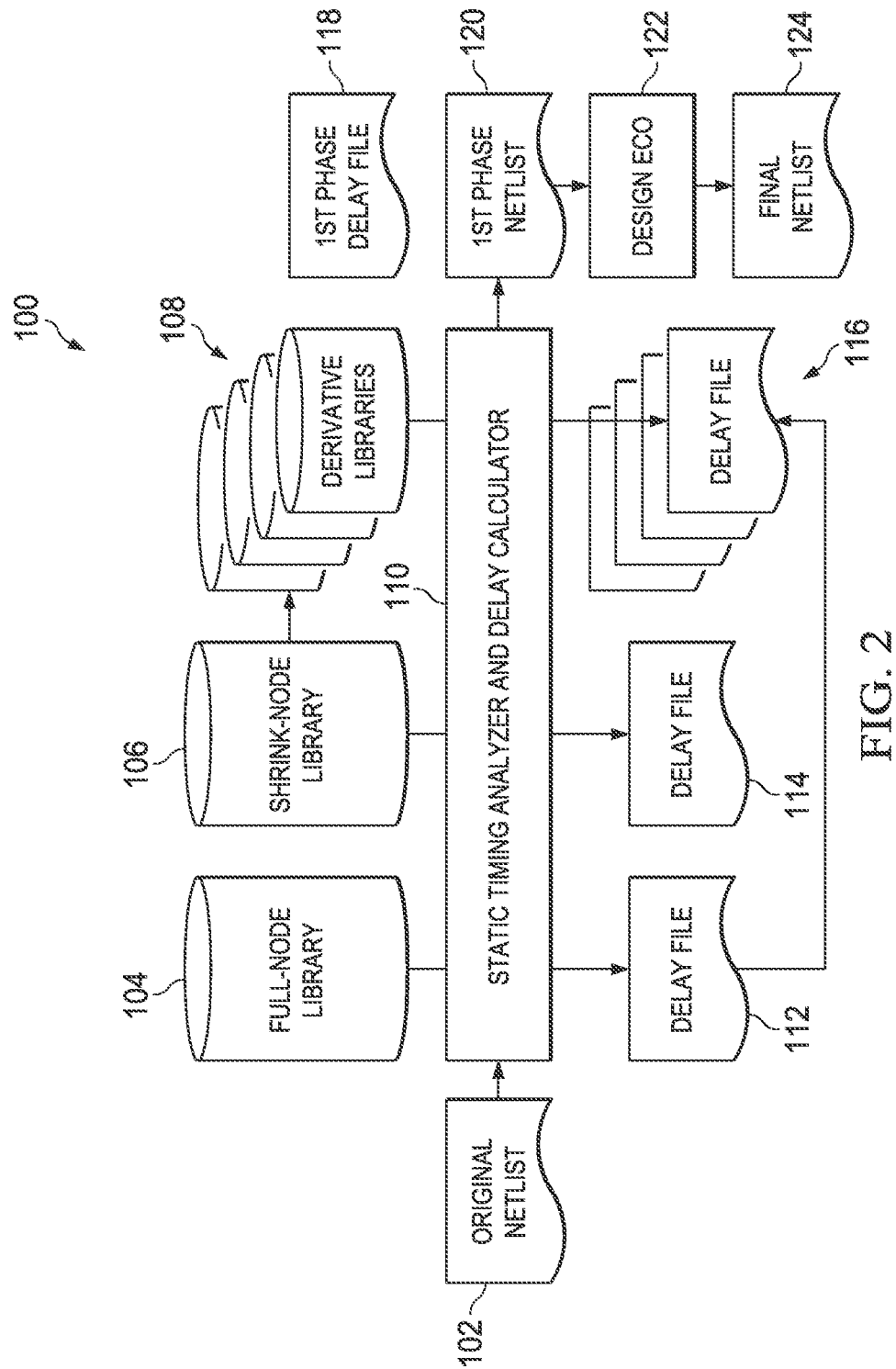
FIG. 2 is an exemplary process flow for a first phase of circuit migration in accordance with an embodiment of the present invention.

FIG. 2 is an exemplary process flow for a first phase 100 of circuit migration in accordance with an embodiment. Initially, an original netlist 102 is provided. The original netlist 102 is an electronic file that represents the layout of the integrated circuit at the original full node technology. The original netlist 102 may represent the gate level layout, a transistor level layout, or any other representation. Such representations are well known in the art. The electronic file of the original netlist 102 may be provided through access to the memory 8 or the mass storage 10, input from the I/O interface 16 such as through user input, remote access from a user, server, or database via the network interface 18, or the like. Throughout the remainder of the process, CPU 6 may access the electronic file of the original netlist 102 via the bus 12.

The original netlist 102 is made up of many cells. The cells could be a single transistor cell, logic cells, such as NOR, OR, NAND, AND, or flip-flop cells, or other functional units. These cells are derived from the original netlist 102 to generate a full node library 104 comprising a file for each cell. The files for each cell of the full node library 104 may be generated by the CPU 6 after accessing the electronic file of the original netlist 102, by separate input through the I/O interface 16 or network interface 18 independently from any access to the original netlist 102, by separately accessing pre-stored cells in the memory 8 or mass storage 10, the like. Throughout the process the full node library 104 may be saved in the memory 8 or mass storage 10 for accessing. Throughout the remainder of the process, CPU 6 may access the full node library 104 via the bus 12.

From the full node library 104, a shrink node library 106 is generated by scaling down the representation of the dimensions in the file by a fixed factor to obtain the size of the shrink node. For example, if the original node technology was 65 nm and the shrink node technology is 55 nm, the fixed factor would be approximately 0.846 (or 55/65). The CPU 6 may access the full node library 104 and may scale the dimensions of the cells contained in the full node library 104 by the fixed factor to generate the shrink node library. The shrink node library 104 may also be saved in the memory 8 or the mass storage 10 for later access.

Both the full node library 104 and the shrink node library 106 are put through a static timing analyzer and delay calculator 110 to determine the timing performance of each cell in the libraries 104 and 106. The static timing analyzer and delay calculator 110 is a function performed by the CPU 6 by accessing and analyzing the electronic representation of each cell's layout as contained in the full node library 104 and in the shrink node library 106 to determine the timing performance of the cell. The CPU 6 generates a delay file containing the timing performance for the cells contained in each library, such as in FIG. 2, delay file 112 is generated for the full node library 104, and delay file 114 is generated for the shrink node library 106. The delay files 112 and 114 may each contain two groups of data, the timing performance of each cell and the timing performance of each interconnect between the cells. The delay files 112 and 114 may be saved in the memory 8 or the mass storage 10 for later access.

After delay files 112 and 114 are generated, the files are compared to determine if the timing performance of the shrink node library 106 meets the timing performance of the full node library 104. The CPU 6 may access the delay files 112 and 114 and compare the timing performance of corresponding cells, such as by executing a loop to compare each cell and interconnect of in the delay file 114 to the delay file 112. The basic comparison in embodiments may be the transistor stage delay and the interconnect delay; however, if the driver, target, and load information is known, the slew delay may also be compared. If the timing performance of the delay file 114 for the shrink node library 106 equals or is within an acceptable range of the timing performance of the delay file 112 for the full node library 104, the cells in the shrink node library 106 will replace corresponding full node cells in the original net list 102 to form a first phase netlist 120 that is output. The CPU 6 may replace the cells in the original netlist 102 with cells from the shrink node library 106 to form the first phase netlist 120 such that the electronic file of the original netlist 102 is over-written, or the CPU 6 may create a new electronic file comprising corresponding cells from the shrink node library 106 to form the first phase netlist 120. A first phase delay file 118 is also generated for the first phase netlist 120. The CPU 6 may also generate the first phase delay file 118. Both the first phase netlist 120 and the first phase delay file 118 may be saved in the memory 8 or the mass storage 10, uploaded to a remote user, server, or database via the network interface 18, output through the I/O interface 16, output visually by the display 20 via the video adapter 14, or the like. The first phase 100 then may proceed to a second phase design engineering change order (ECO) 122 that outputs a final netlist 124.

However, if the timing performance of the delay file 114 is not within an acceptable range of the timing performance of the delay file 112, derivative libraries 108 will be generated from the cells of the shrink node library 106 that do not have an acceptable timing performance. The cells in the derivative library 108 are variations, except with the same footprint, of the cells of the shrink node library 106, for example, a derivative cell may have only a different gate length than the shrink node cell, such that the derivative cell will have a different timing performance from the shrink node cell.

Figure 4A:
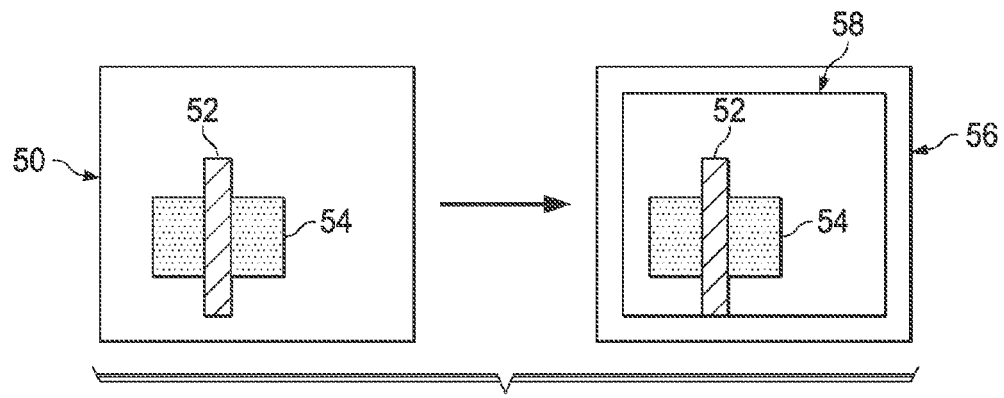
FIG. 4A through 4H are exemplary derivative cells of a shrink node library.
Figure 4B:
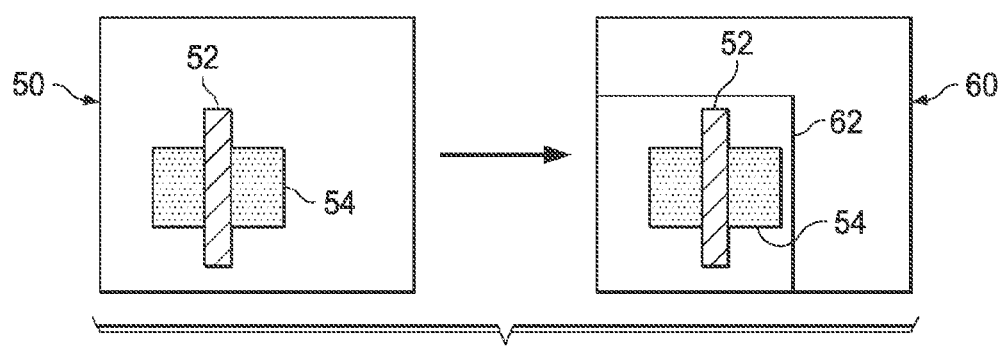

FIGS. 4A through 4H illustrate examples of the derivative cells that may be contained in a derivative library 108. FIG. 4A shows a cell 50 in a shrink node library 106. The cell 50 has a transistor with a gate 52 and an active area 54. FIG. 4A further illustrates a derivative cell 56 with a two nanometer marker 58. In this embodiment, the marker is a gate critical dimension (CD) marker layer. The gate CD maker is a graphic data system (GDS) computer aided design (CAD) layer commonly used in mask making. Once the GDS has such a gate CD marker, a mask making program will produce pre-defined gate lengths according to the maker layer. Some marker layers are for +2 nm and some may be for –2 nm. By changing the gate CD in the mask, the gate silicon performance within the cell will change accordingly. FIG. 4B illustrates the cell 50 and a derivative cell 60 with a four nanometer marker 62 for the transistor of the cell 50.

Figure 4C:
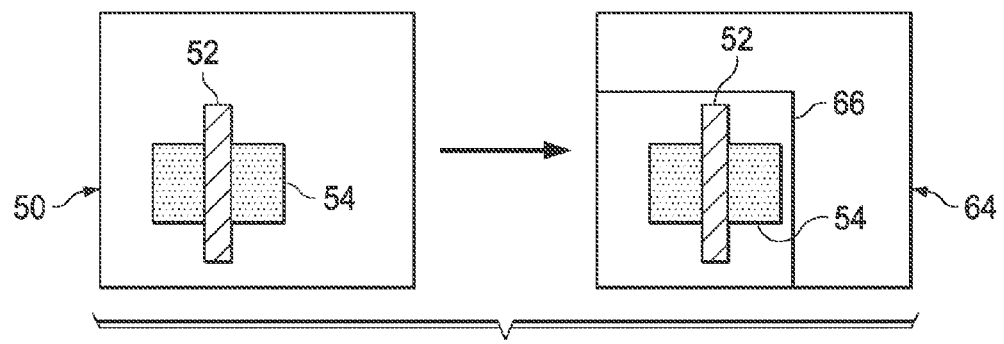
Figure 4D:
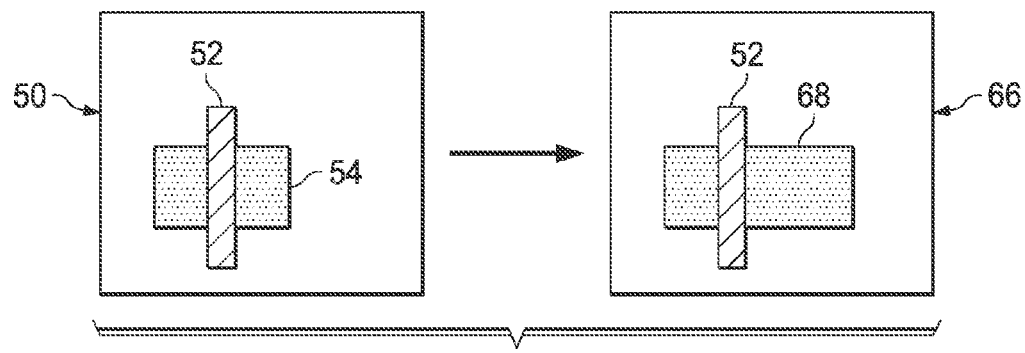
Figure 4E:
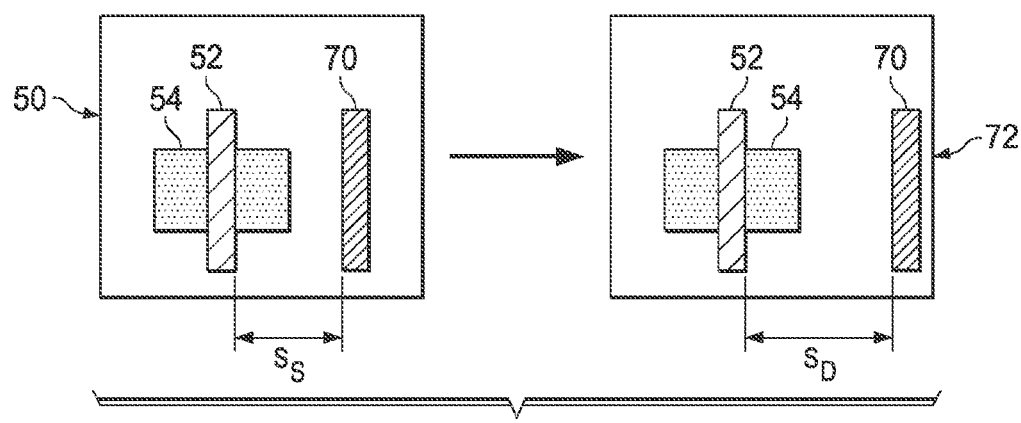
Figure 4F:
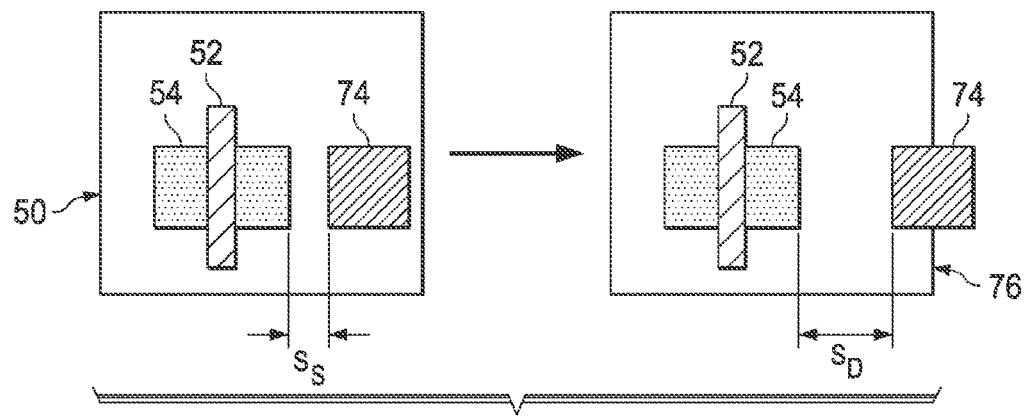
Figure 4G:
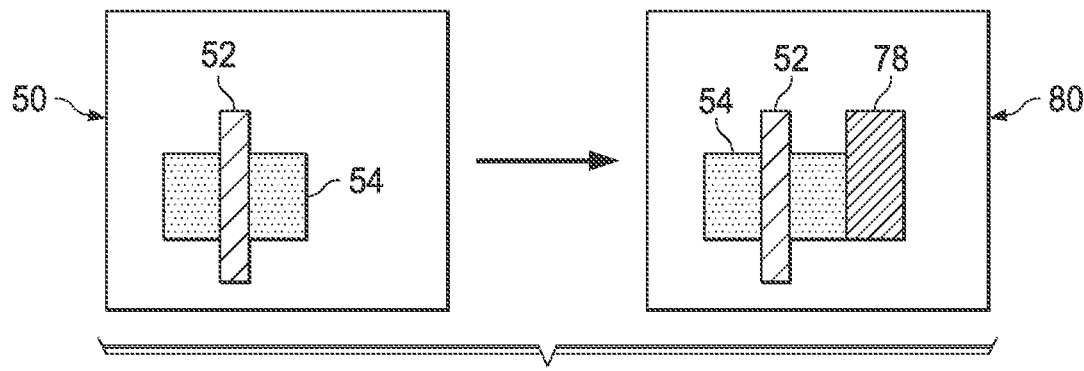
Figure 4H:
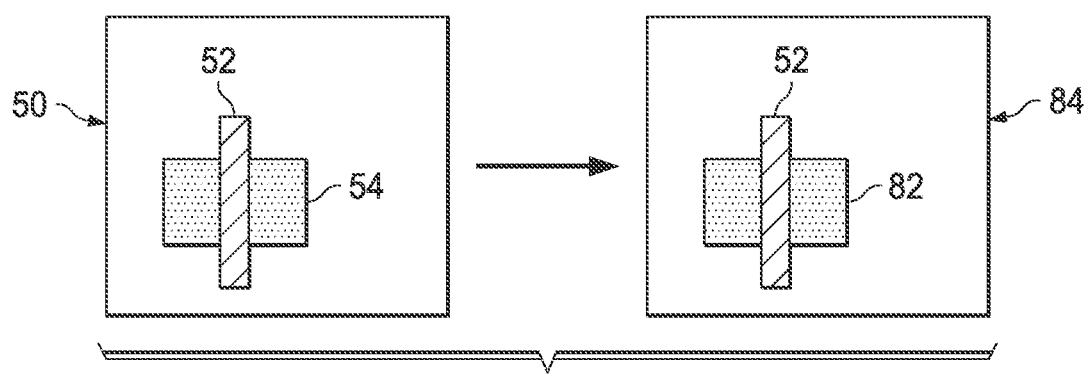

FIG. 4C illustrates the cell 50 and a derivative cell 64 with a high threshold voltage implant area 66. FIG. 4D shows the cell 50 and a derivative cell 66 with a biased, or extended, active area 68. Note that the bias or extension is not to scale and is exaggerated. FIG. 4E illustrates the cell 50 further comprising a gate 70 to another transistor and the spacing $S_S$ between the gates 52 and 70. FIG. 4E further shows a derivative cell 72 in which the spacing $S_D$ is increased from the spacing $S_S$ in the cell 50. FIG. 4F illustrates the cell 50 further comprising an active area 74 to another transistor and the spacing $S_S$ between the active areas 54 and 74. FIG. 4F further shows a derivative cell 76 in which the spacing $S_D$ is increased from the spacing $S_S$ in the cell 50. The derivative cell 80 in FIG. 4G shows an active area 78 rounding adjacent to the active area 54 to effectively increase the active area 54 width. FIG. 4H shows a derivative cell 84 with an active area 82 with an increased width compared to the active area 54 in the cell 50. Other variations may include varying some polysilicon gate rounding, or similar variations discussed above. Further, the variations may be applied to only one transistor within the cell, or may be applied to more than one transistor. Typically, the cells in the shrink node library 106 will have a faster timing performance than the cells in the full node library 104 because generally smaller technologies simply have higher speeds. Accordingly, the derivative libraries 108 may comprise more slower cells than faster cells.

The derivative library 108 may be generated by the CPU 6 by executing program code to automatically generate the variations of cells that make up the shrink node library 106 or by executing program code that generates variations of the cells at the guidance of a user through the I/O interface 16 and/or the display 20 via the video adapter 14. Further, the derivative library 108 may be generated at a remote location and uploaded through the I/O interface 16 or the network interface 18 or may be pre-generated and saved in the memory 8 or the mass storage 10 before the execution of the process. The derivative library 108 may also be saved in the memory 8 or the mass storage 10 for access during the remainder of the process.

The derivative libraries 108 are then passed through the static timing analyzer and delay calculator 110 to determine the derivative cells' timing performances that are placed into corresponding delay files 116. Again, the static timing analyzer and delay calculator 110 is a function performed by the CPU 6 by accessing and analyzing the electronic representation of each cell's layout as contained in the derivative libraries 108 to determine the timing performance of the cell. The CPU 6 generates delay files 116 containing the timing performance for the cells contained in the derivative libraries 108. The delay files 116 may be saved in the memory 8 or the mass storage 10 for later access.

Each delay file 116 is then compared to delay file 112 to determine which delay file 116 would minimize the difference between the timing performance for the cells in the full node library 104 and the derivative cells in the derivative libraries 108. The CPU 6 may execute program code that loops to compare each delay file 116 to the delay file 112 of the full node library 104 or any other program code that otherwise compares each delay file 116 to the delay file 112 such that a cell in the derivative library 108 is identified as minimizing the timing performance difference between the cell from the full node library 104 and the corresponding cell from the derivative library 108.

Once the derivative cells that minimize the difference are identified, those cells replace the cells in the original netlist 102 to form a scaled down first phase netlist 120. The CPU 6 may replace the cells in the original netlist 102 with cells from the derivative libraries 108 to form the first phase netlist 120 such that the electronic file of the original netlist 102 is over-written, or the CPU 6 may create a new electronic file comprising corresponding cells from the derivative libraries 108 to form the first phase netlist 120. A first phase delay file 118 is also generated for the first phase netlist 120. The CPU 6 may also generate the first phase delay file 118. Both the first phase netlist 120 and the first phase delay file 118 may be saved in the memory 8 or the mass storage 10, uploaded to a remote user, server, or database via the network interface 18, output through the I/O interface 16, output visually by the display 20 via the video adapter 14, or the like. The first phase 100 then may proceed to a second phase design ECO 122 that outputs a final netlist 124. In some embodiments, a second stage design ECO 122 is not implemented and the first phase netlist 120 is output as the final shrink node layout.

Figure 3:
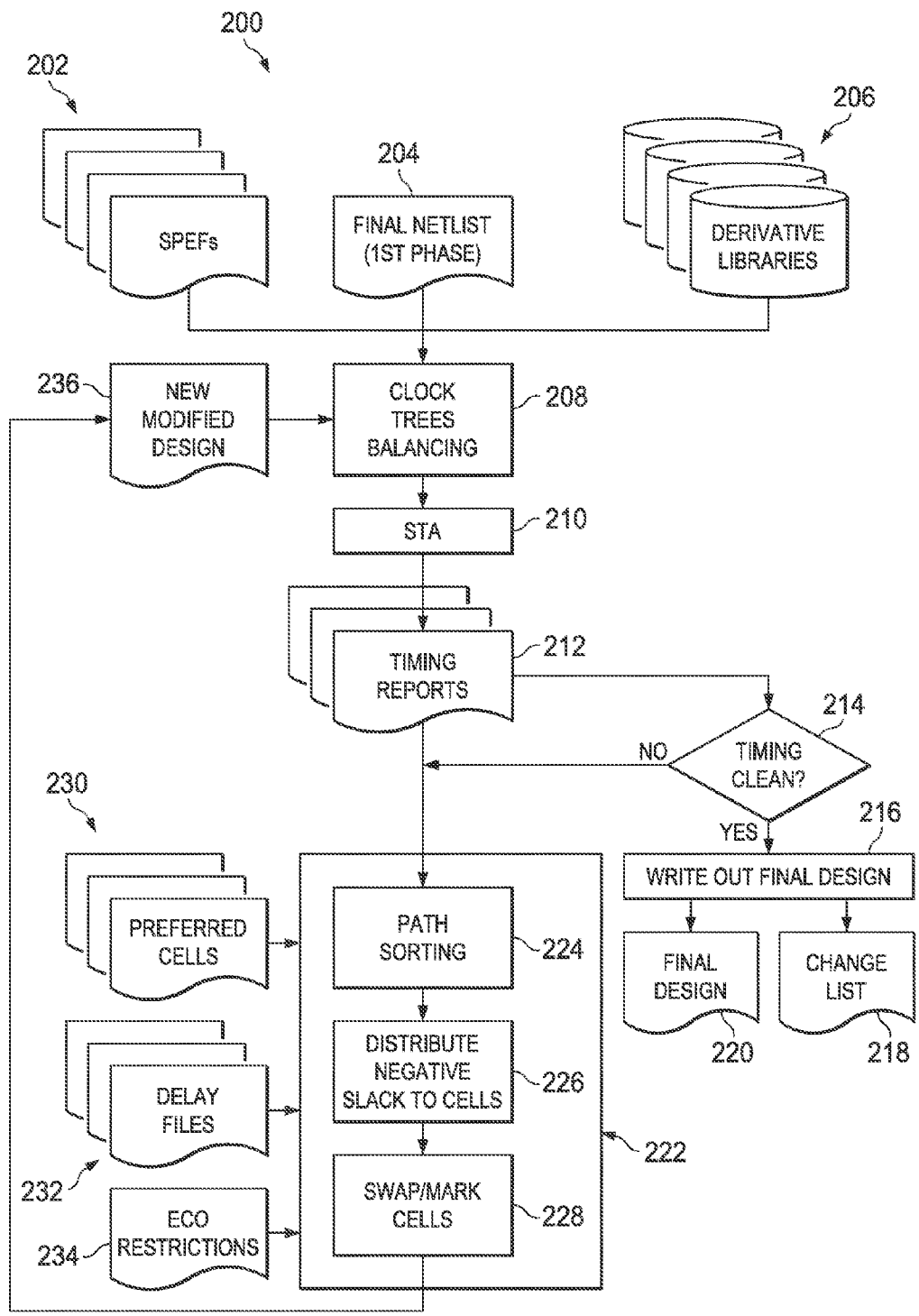
FIG. 3 is an exemplary process flow for a second phase of circuit migration in accordance with an embodiment of the present invention.

FIG. 3 illustrates a process flow for a second phase 200 according to embodiments. The second phase 200 may be performed if parameters for timing performance are known, for example, to obtain a better timing margin. The second phase 200 begins by accessing standard parasitic exchange format files (SPEFs) 202 that contain the desired performance parameters of the final design based on interconnect wire parasitic capacitances and resistances, the final netlist 204 from the first phase, and the derivative libraries 206 from the first phase. The SPEFs 202, the final netlist 204, and the derivative libraries 206 may be provided through access to the memory 8 or the mass storage 10, input from the I/O interface 16 such as through user input, remote access from a user, server, or database via the network interface 18, or the like. Throughout the remainder of the process, CPU 6 may access the SPEFs 202, the final netlist 204, and the derivative libraries 206 via the bus 12.

A clock trees balancing step 208 is then initiated such that the CPU 6 performs program code to identify each sequential data path in the layout represented by the final netlist 204. Once every data path is identified, a static timing analyzer 210 determines the timing performance of each sequential data path. Again, the static timing analyzer 210 is a function performed by the CPU 6. The timing performance of each path is then recorded into a file of the timing reports 212. Multiple timing reports 212 may be generated because a layout may have multiple operating modes, such as the normal functional mode, a test mode, or the like, and each mode may require a single timing report. The CPU 6 may generate these files and save them to the memory 8 or mass storage 10, upload them to a server, remote user, or database via the network interface 18, or export them through the I/O interface 16. Also, the results of the timing analysis may be displayed on the display 20 via the video adapter 14.

Each timing report 212 is then analyzed to determine if the timing report 212 is clean 214, or in other words, to determine if the timing report 212 meets the parameters in the SPEFs 202 for the timing performance for the layout. This function is also performed by the CPU 6 executing program code, such as by a loop that analyzes each path recorded in the timing reports 212. If the timing is clean, the CPU 6 generates 216 the final design 220 along with a change list 218 of any changes made in the design from the end of the first phase. The CPU 6 may generate these files and save them to the memory 8 or mass storage 10, upload them to a server, remote user, or database via the network interface 18, or export them through the I/O interface 16. Also, the results of the timing analysis may be displayed on the display 20 via the video adapter 14.

However, if the timing is not clean, a modification sequence 222 is initiated. The modification sequence 222 comprises path sorting 224, distributing negative slack to cells 226, and swapping and/or marking cells 228. To accomplish the modification sequence 222, preferred cells netlists 230 from the cells in the derivative libraries 206, delay files 232, and any ECO restrictions 234 may be necessary. The CPU 6 may execute program code to initiate this modification sequence 222 and may access the preferred cells netlists 230, delay files 232, and any ECO restrictions 234 via the bus 12 from the memory 8 or mass storage 10, from input through the I/O component, download through the network interface 18, or the like.

The path sorting 224 identifies common points or paths between multiple sequential data paths. Once the common points or paths are identified, the modification sequence 222 can analyze the common point or path instead of each individual sequential data path that contains the common point or path. Thus, the number of paths that needs to be analyzed is reduced, and the process is more efficient.

Distributing negative slack to cells 226 includes identifying cells that violate the required timing performance and distributing the amount of the timing violation, or negative slack, to subsequent cells. By doing this, a path that contains a cell that has a timing violation may otherwise meet the timing performance parameters of the path if subsequent cells operate faster to make up for the timing violation. If subsequent cells do not make up for the violation, the cells that violate the timing performance parameters are swapped 228 with other preferred cells 230 if those preferred cells 230 timing performance according to the delay files 232 would make the cells' timing performance meet or get closer to the parameters contained in the SPEFs 202. However, ECO restrictions 234 may prevent any modification of cells in the path. In such a case, those cells are marked 228, and subsequent cells may be swapped with other preferred cells 230 in order to make up the timing violation of the cell that cannot be modified.

The modification sequence 222 then generates a new modified design 236 that loops back through the process again, beginning at the clock trees balancing step 208. The CPU 6 may generate the new modified design 236 by creating a new file comprising the first phase final netlist 204 except for cells that have been replaced by preferred cells 230 or that have been marked, or by over-writing the first phase final netlist 204 with the preferred cells 230 that replaced cells in the first phase final netlist 204 and with the marked cells. The process will continue to loop until the timing reports 212 indicate clean timing 214 such that the layout meets all design parameters. The CPU then generates the final design 216 into a final design file 220 and generates a change list file 218. The CPU 6 may generate these files and save them to the memory 8 or mass storage 10, upload them to a server, remote user, or database via the network interface 18, or export them through the I/O interface 16. Also, the files or representations of the files may be displayed on the display 20 via the video adapter 14.

To better illustrate the sequence just described, assume a common path contains cells 1 through 10 in sequence. The parameters require cell 5 to have a timing performance of 5 nanoseconds. However, cell 5 can only operate at a speed of 5.1 nanoseconds. Cell 5 would then have a timing violation of 100 picoseconds. First, cells 6 through 10 would be analyzed to see if the cells could operate at a speed that is at least a combined 100 picoseconds less than the combined required timing performance for those cells. If cells 6 through 10 do, no modification is needed, but if cells 6 through 10 do not, the process will attempt to replace cell 5 with another preferred cell 230. A preferred cell 230 matching cell 5 with a corresponding delay file 232 that would meet the timing performance parameters for cell 5 would then be chosen and would replace cell 5. However, if no such preferred cell 230 exists, a preferred cell 230 that minimizes the timing violation will be chosen and will replace cell 5. Cell 5 is then marked so in subsequent iterations of the loop, other sequential cells will be modified, and not cell 5. Another situation that may exist is when an ECO restriction prevents any modification to cell 5. In that situation, cell 5 will be marked to indicate in subsequent iterations of the loop to modify other sequential cells, or cells 6 through 10.

In a subsequent iteration of the loop, cell 5 will be marked, and the modification sequence 222 will not attempt to modify cell 5. In this iteration, subsequent cells 6 through 10 will be swapped and/or marked to propagate the timing violation throughout the path to make up for the violation. For example, if cell 5 was not modified, the process may attempt to modify a single cell per iteration to propagate the violation, such as by minimizing the violation by swapping cell 6 in one iteration, swapping cell 7 in a following iteration, and so on until the timing performance parameters are met. Alternatively, in a single iteration the process could divide the violation proportionally or in some defined manner, and swap all sequential cells 6 through 10 in the same iteration to preferred cells that meet a respective cell's proportionate share of the violation. In the above example, cells 6 through 10 could be required to reduce the timing by 20 picoseconds per cell. Each cell would then be swapped with a corresponding preferred cell 230 that would increase the speed of each cell by 20 picoseconds. With each of the five cells 6 through 10 reducing their timing performance by 20 picoseconds, the path timing violation created by cell 5 would be eliminated. Also, the process may use any combination of the two methods.

After obtaining a final netlist, either by implementing only the first phase 100 or both the first 100 and second 200 phases, a final integrated circuit layout may be generated from the final netlist by the CPU 6. The generation of the final layout may be accomplished by known methods in the art.

A photomask or many photomasks may be formed as indicated by the final layout to process a semiconductor wafer to form the integrated circuit in the manner indicated by the final layout. The processing may include processes such as forming isolation oxides by local oxidation of silicon (LOCOS) or other shallow trench isolation (STI) processes, ion implantation, and forming additional layers on the semiconductor wafer like additional dielectric layers, polysilicon layer, metal layers, and the like. Further, the processing may also include etching any layer or layers to form the structures as indicated in the final layout.

By implementing embodiments of the present invention, the man hours and effort expended on the design of the shrink node may be drastically reduced compared to the redesign efforts of the prior art. Further, the design quality of embodiments is comparable to that of the prior art processes. However, there may be an area penalty in the layouts when embodiments are used as opposed to prior art processes. Overall, a substantially comparable layout may be designed with a small area penalty but with much less effort spent on the design.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computer program product for providing an adjusted electronic representation of an integrated circuit layout, the computer program product having a non-transitory computer readable medium with a computer program embodied thereon, the computer program which when executed by a processor provides the adjusted electronic representation of the integrated circuit layout, the computer program comprising:
   computer program code for generating a timing performance of at least two paths in a first netlist;
   computer program code for identifying a common path of the at least two paths;
   computer program code for identifying a first cell in the common path that violates a timing performance parameter;
   computer program code for generating a plurality of derivative cells from a subsequent cell that is in the common path after the first cell, wherein each derivative cell comprises a variation of the subsequent cell, the variation including at least one of an additional component in each derivative cell that is not in the subsequent cell or a feature of a component in each derivative cell that is a modification of a corresponding component in the subsequent cell; and
   computer program code for, in response to the identifying the first cell, replacing the subsequent cell with at least one of the plurality of derivative cells to generate a first modified netlist; and
   computer program code for generating a final netlist based on the first modified netlist.

2. The computer program product of claim 1, wherein the at least one of the plurality of derivative cells that replaced the subsequent cell comprises a variation that minimizes the violation of the timing performance parameter.

3. The computer program product of claim 1, wherein the computer program further comprises computer program code for a loop to provide a modified timing performance of the common path in the first netlist as modified in the modified netlist, to identify a second cell in the common path to be compensated, and to provide a second modified netlist comprising a variation of the first modified netlist to compensate for the second cell.

4. The computer program product of claim 3, wherein the computer program further comprises computer program code for a loop to provide a second modified timing performance of the common path in the first netlist as modified in the second modified netlist, to identify a third cell in the common path to be compensated, and to provide a third modified netlist comprising a variation of the second modified netlist to compensate for the third cell.

5. The computer program product of claim 1, wherein the final netlist comprises at least one of the plurality of derivative cells.

6. A method for providing an adjusted electronic representation of an integrated circuit layout, the method comprising:
using one or more processor:
generating a timing performance of a path in a first netlist;
identifying a first cell in the path that violates a timing performance parameter;
generating a plurality of derivative cells from a subsequent cell that is in the path after the first cell, wherein each derivative cell comprises a variation of the subsequent cell;
in response to the identifying the first cell, replacing the subsequent cell with at least one of the plurality of derivative cells to generate a first modified netlist, wherein the variation of the at least one of the plurality of derivative cells reduces the violation of the timing performance parameter; and
generating a final netlist based on the first modified netlist;
providing a final layout based on the final netlist; and
processing a semiconductor wafer to form an integrated circuit as indicated by the final layout.

7. The method of claim 6, further comprising identifying a common path of the path and another path in the first netlist, wherein the common path comprises the first cell in the path that violates the timing performance parameter.

8. The method of claim 6, further comprising:
providing a modified timing performance of the path in the first netlist as modified in the modified netlist;
identifying a second cell in the path to be compensated; and
providing a second modified netlist comprising a variation of the first modified netlist to compensate for the second cell.

9. The method of claim 8, further comprising:
providing a second modified timing performance of the path in the first netlist as modified in the second modified netlist;
identifying a third cell in the path to be compensated; and
providing a third modified netlist comprising a variation of the second modified netlist to compensate for the third cell.

10. The method of claim 6, wherein the final netlist comprises at least one of the derivative cells.

11. The method of claim 6, wherein the variation of the subsequent cell includes at least one of an additional component in each derivative cell that is not in the subsequent cell or a feature of a component in each derivative cell that is a modification of a corresponding component in the subsequent cell.

12. A method comprising:
using one or more processor:
generating a timing performance of a first data path;
identifying a first cell in the first data path that violates a timing performance parameter;
generating a derivative cell from a subsequent cell that is in the first data path after the first cell;
in response to the identifying the first cell, replacing the subsequent cell with at the derivative cell to generate a first modified netlist; and
generating a final netlist based on the first modified netlist;
providing a final layout based on the final netlist; and
processing a semiconductor wafer to form an integrated circuit as indicated by the final layout.

13. The method of claim 12, wherein the derivative cell includes a variation of the subsequent cell, the variation including at least one of an additional component in each derivative cell that is not in the subsequent cell or a feature of a component in each derivative cell that is a modification of a corresponding component in the subsequent cell.

14. The method of claim 13, wherein the variation of the derivative cell reduces the violation of the timing performance parameter.

15. The method of claim 12, wherein the final netlist comprises the derivative cell.

16. The method of claim 12, further comprising identifying a common data path of the first path and another data path in the first netlist, wherein the common data path comprises the first cell in the first data path that violates the timing performance parameter.

17. The method of claim 12, further comprising:
identifying each of the data paths in the first modified netlist; and
generating a timing performance of each of the identified data paths in the first modified netlist.

* * * * *